United States Patent [19]
Kato et al.

[11] Patent Number: 5,848,023
[45] Date of Patent: Dec. 8, 1998

[54] SEMICONDUCTOR MEMORY DEVICE OPERABLE IN BURST MODE AND METHOD OF CONTROLLING THE SAME

[75] Inventors: Yoshiyuki Kato; Junji Monden, both of Tokyo, Japan

[73] Assignee: NEC Corporation, Tokyo, Japan

[21] Appl. No.: 790,802

[22] Filed: Jan. 30, 1997

[30] Foreign Application Priority Data

Jan. 30, 1996  [JP]  Japan .................................. 8-014051

[51] Int. Cl.⁶ ...................................................... G11C 8/00
[52] U.S. Cl. ................ 365/230.09; 395/855; 395/421.07
[58] Field of Search ....................... 365/230.09; 395/405, 395/421.07, 421.08, 855

[56] References Cited

U.S. PATENT DOCUMENTS

| 5,327,390 | 7/1994 | Takasugi .............................. 395/230.06 |
| 5,559,990 | 9/1996 | Cheng et al. ........................... 395/484 |
| 5,634,030 | 5/1997 | Nakano ............................... 395/421.03 |
| 5,634,139 | 5/1997 | Takita ....................................... 395/855 |

*Primary Examiner*—David C. Nelms
*Assistant Examiner*—Hoai Ho
*Attorney, Agent, or Firm*—Young & Thompson

[57] ABSTRACT

A circuit for generating memory cell array block selective signals which select memory cell array blocks included in a semiconductor memory device operable in burst mode, wherein the circuit is operated under the control of a burst mode control signal to generate memory cell array block selective signals sequentially and one by one through different and successive time cycles so that, according to the memory cell array block selective signals sequentially generated, the memory cell array blocks are also sequentially selected one by one through the different and successive time cycles for sequentially supplying a word line driver circuit with the memory cell array block selective signals one by one through the different and successive time cycles whereby memory cells included in different memory cell array blocks are sequentially selected one by one through the different and successive time cycles.

11 Claims, 6 Drawing Sheets

SEMICONDUCTOR MEMORY DEVICE OPERABLE IN BURST MODE AND METHOD OF CONTROLLING THE SAME

BACKGROUND OF THE INVENTION

The present invention relates to a semiconductor memory device operable in a burst mode and a method of controlling the same.

As in recent years improvement in high speed performance of the central processing unit (CPU) has been required, it has been proposed to provide a high speed cash memory between the main memory using a dynamic random access memory (DRAM) operable in slow access time and the CPU showing high speed performances in order to obtain high speed performances of the system including memory device and the CPU. When data are red out from the main memory, those data are also stored in the cash memory so that if read out operation of data from the same address of the main memory is required in later, then the same data as those data are red out from the cash memory at higher speed. This results in improvement in high speed performance of the system including the memory device and the CPU.

The above cache memory is operated to synchronize with clock signals generated from the CPU. The address is transferred from the CPU to the cache memory in one clock. Data having been red out from the cash memory are transferred to the CPU in one clock. Then, a time corresponding to two clocks is required to transfer the address from the CPU to the cash memory for read out operation of data from the cash memory and subsequent transfer thereof to the CPU. Accordingly, if the data stored in four addresses are required to be read out continuously, then a time corresponding to eight clocks is necessary. It is frequently required to read out data from plural addresses sequentially, for which reason a specific method of reading out the data from the cache memory was proposed, wherein the read out operation is carried out in a specific mode so called as "burst mode".

The data reading out operation in the burst mode will be described as follows. In the first clock, a first address is transferred from the CPU to the cache memory. The data reading out operation is commenced to data stored in the first address. In the second clock, data read out from the second address in the cache memory is transferred to the CPU. In the third clock, since the cache memory has already entered into the burst mode, without transferring the address from the CPU to the cache memory, data are subsequently read out from the third address in the cache memory and transferred to the CPU. In the fourth clock, also without transferring the address from the CPU to the cache memory, data are then read out from the fourth address in the cache memory and transferred to the CPU. In the fifth clock, also without transferring the address from the CPU to the cache memory, data are then read out from the fifth address in the cache memory and transferred to the CPU. As described above, if the reading out operation is carried out in the burst mode, the data from the four addresses may be read out in a time corresponding to the five clocks only. By contrast, if the reading out operation is carried out in the normal mode different from the burst mode, then a time corresponding to the eight clocks is necessary to read out the data from different four addresses in the cache memory.

Not only the data reading out operation described above but also the data writing operation may be carried out in the burst mode.

Figure 1A:
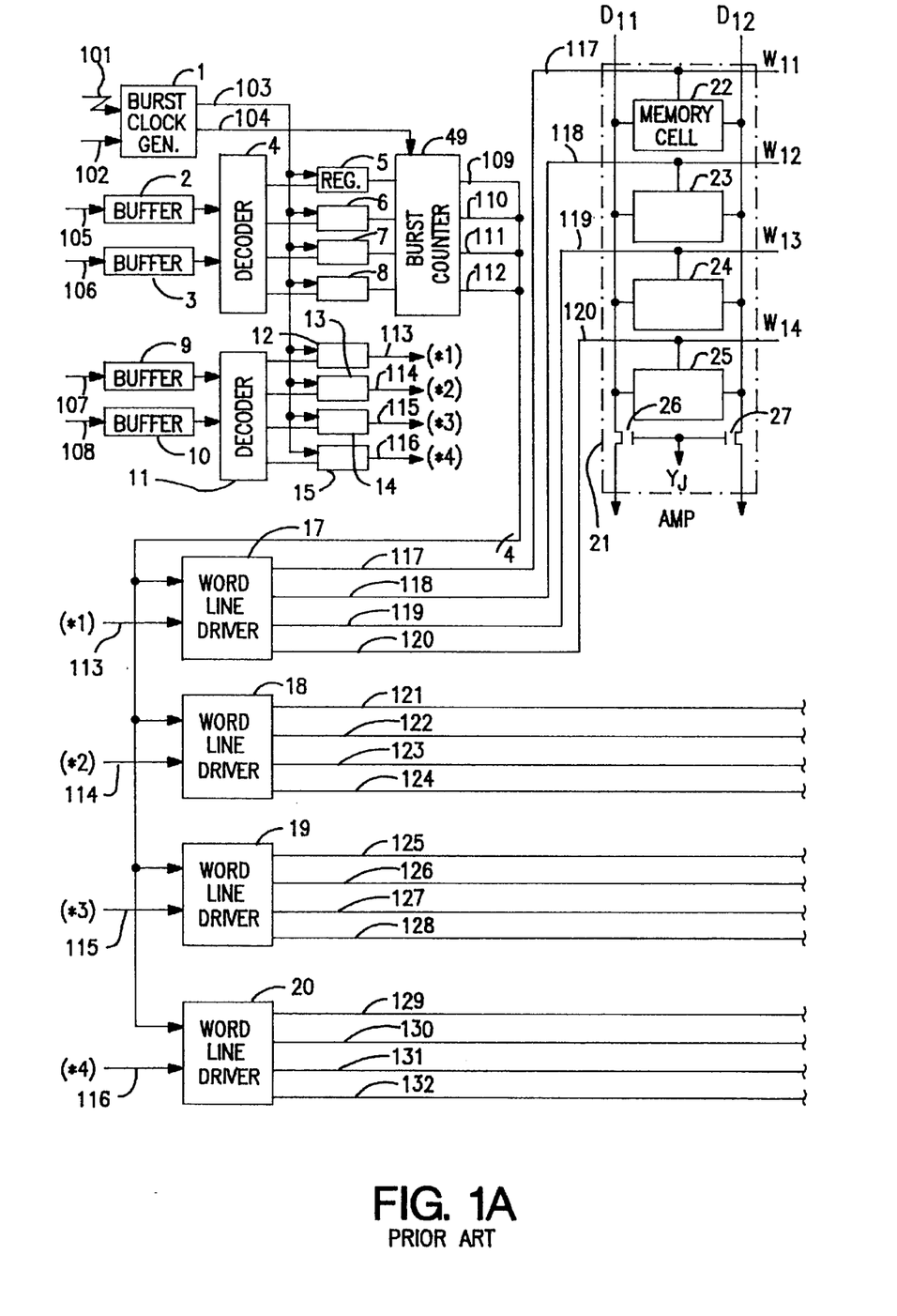
FIGS. 1A and 1B are a circuit diagram illustrative of the conventional cache memory device operable in the burst mode.
Figure 1B:
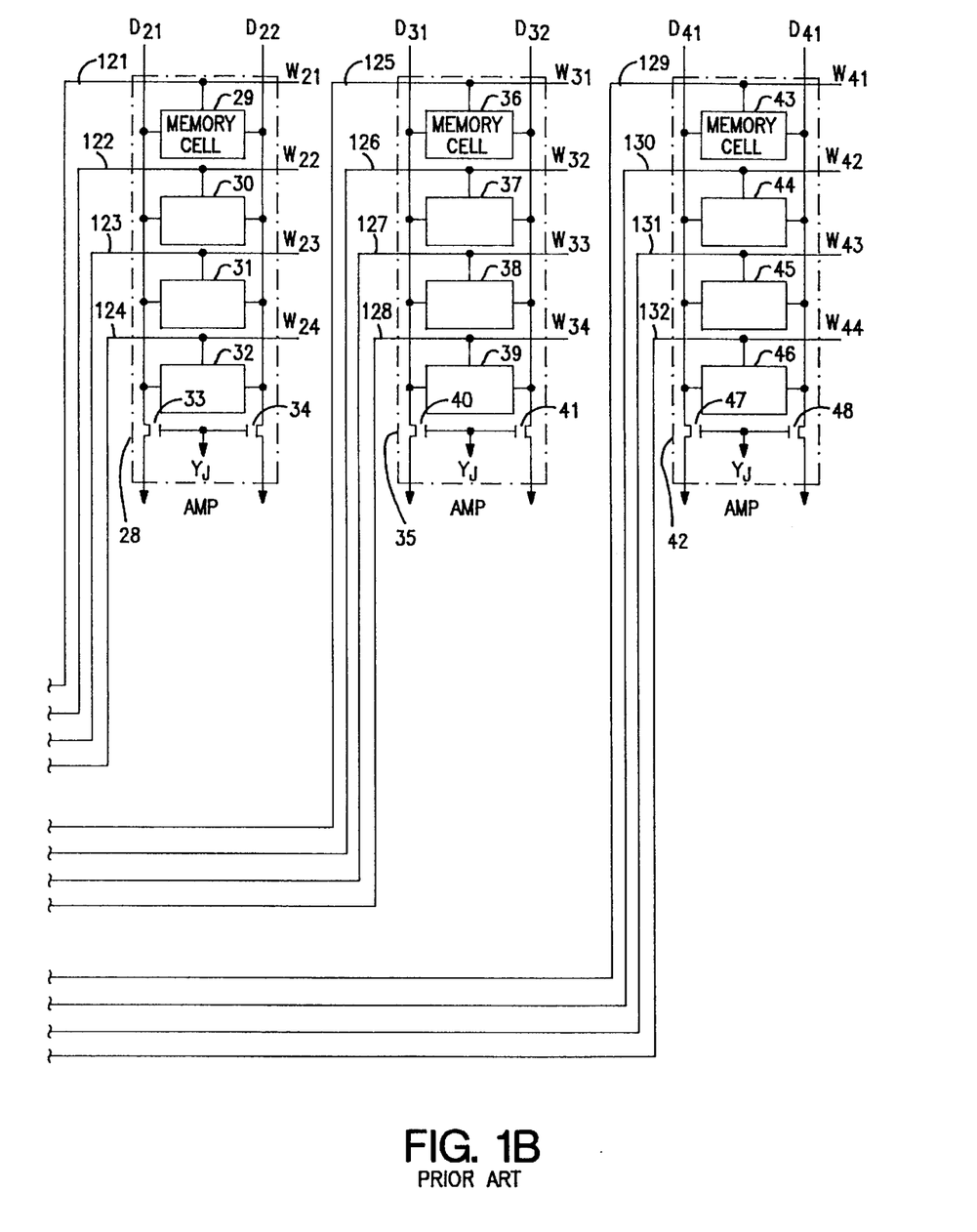

FIGS. 1A and 1B are illustrative of a synchronous static random access memory device operable in the burst mode.

As illustrated in FIGS. 1A and 1B, synchronous static random access memory device comprises the following elements. A burst operating control clock generator circuit 1 is provided, which is designed to receive a clock signal 101 and a burst mode control signal 102 and generate clock signals 103 and 104. An address buffer 2 is provided, which is designed to receive a word line corresponding address signal 105 which corresponds to the word line and generate the said word line corresponding address signal 105. An address buffer 3 is also provided, which is designed to receive a word line corresponding address signal 106 which corresponds to the word line and generate the said word line corresponding address signal 106. A decoder 4 is provided which is connected to the address buffers 2 and 3 for receipt of the word line corresponding address signals 105 and 106 and generating the decoded signals. Four registers 5, 6, 7, and 8 are provided which are connected to the decoder 4 for receipt of the decoded address signals and also connected to the burst operating control signal generator circuit 1 for receipt of the clock signal 103 so that the registers 5, 6, 7, and 8 are operated to temporarily store the decoded address signals under the control of the clock signal 103 from the burst operating control signal generator circuit 1. A burst counter 49 is provided, which is connected to the registers 5, 6, 7, and 8 for receipt of the decoded address signals and also connected to the burst operating control signal generator circuit 1 for receipt of the clock signal 104 so that the burst counter 49 performs a counting operation on the basis of the clock signal to generate word line selective signals 109, 110, 111 and 112. An address buffer 9 is provided which is designed to receive a digit line corresponding address signal 107 corresponding to the digit line and generate that address signal 107. An address buffer 10 is also provided which is designed to receive a digit line corresponding address signal 108 corresponding to the digit line and generate that address signal 108. A decoder 11 is provided which is connected to the address buffers 9 and 10 for receipt of the digit line corresponding address signals 107 and 108 to generate decoded address signals. Four registers 12, 13, 14 and 15 are provided which are connected to the decoder 11 for receipt of the decoded address signals and also connected to the burst operating control signal generator circuit 1 for receipt of the clock signal 103 so that the registers 12, 13, 14 and 15 are operated to temporary store the decoded address signals under the control of the clock signal 103 from the burst operating control signal generator circuit 1 and to generate block selective signals 113, 114, 115 and 116.

A word line driver 17 is further provided, which is connected to the burst counter 49 for receipt of the word line selective signals 109, 110, 111 and 112 and also connected to the register 12 for receipt of the block selective signal 113 so that the word line driver 17 generates word line driving signals 117, 118, 119 and 120 in accordance with the word line selective signals 109, 110, 111 and 112 for selection of word lines of memory cells in a first memory cell array block 21. The first memory cell array block 21 has four memory cells 22, 23, 24 and 25, each of which is connected to bit lines. In the first memory cell array block 21, the memory cell 22 is connected to a word line W11 which is connected to the word line driver 17 so that the word line driving signal 117 is transmitted through the word line W11 to the memory cell 22. Namely, the word line driving signal 117 is a signal for selecting the word line W11 connected to the memory cell 22. In the first memory cell array block 21, the memory cell 23 is connected to a word line W12 which is connected to the word line driver 17 so that the word line driving signal 118 is transmitted through the word line W12 to the memory cell 23. Namely, the word line driving signal 118 is a signal for selecting the word line W12 connected to the memory cell 23. In the first memory cell array block 21, the memory cell 24 is connected to a word line W13 which is connected to the word line driver 17 so that the word line driving signal 119 is transmitted through the word line W13 to the memory cell 24. Namely, the word line driving signal 119 is a signal for selecting the word line W13 connected to the memory cell 24. In the first memory cell array block 21, the memory cell 25 is connected to a word line W14 which is connected to the word line driver 17 so that the word line driving signal 120 is transmitted through the word line W14 to the memory cell 25. Namely, the word line driving signal 120 is a signal for selecting the word line W14 connected to the memory cell 25. In the first memory cell array block 21, a pair of MOS field effect transistors 26 and 27 are provided which are respectively connected in series onto the bit lines. Gates of the paired MOS field effect transistors 26 and 27 are connected to each other for receipt of the common gate signal Yj.

A word line driver 18 is further provided, which is connected to the burst counter 49 for receipt of the word line selective signals 109, 110, 111 and 112 and also connected to the register 13 for receipt of the block selective signal 114 so that the word line driver 18 generates word line selective signals 121, 122, 123 and 124 in accordance with the word line driving signals 109, 110, 111 and 112 for selection of word lines of memory cells in a second memory cell array block 28. The second memory cell array block 23 has four memory cells 29, 30, 31 and 32, each of which is connected to bit lines. In the second memory cell array block 28, the memory cell 29 is connected to a word line W21 which is connected to the word line driver 18 so that the word line driving signal 121 is transmitted through the word line W21 to the memory cell 29. Namely, the word line driving signal 121 is a signal for selecting the word line W21 connected to the memory cell 29. In the second memory cell array block 28, the memory cell 30 is connected to a word line W22 which is connected to the word line driver 18 so that the word line driving signal 122 is transmitted through the word line W22 to the memory cell 30. Namely, the word line driving signal 122 is a signal for selecting the word line W22 connected to the memory cell 30. In the second memory cell array block 28, the memory cell 31 is connected to a word line W23 which is connected to the word line driver 18 so that the word line driving signal 123 is transmitted through the word line W23 to the memory cell 31. Namely, the word line driving signal 123 is a signal for selecting the word line W23 connected to the memory cell 31. In the second memory cell array block 28, the memory cell 32 is connected to a word line W24 which is connected to the word line driver 18 so that the word line driving signal 124 is transmitted through the word line W24 to the memory cell 32. Namely, the word line driving signal 124 is a signal for selecting the word line W24 connected to the memory cell 32. In the second memory cell array block 28, a pair of MOS field effect transistors 33 and 34 are provided which are respectively connected in series onto the bit lines. Gates of the paired MOS field effect transistors 33 and 34 are connected to each other for receipt of the common gate signal Yj.

A word line driver 19 is further provided, which is connected to the burst counter 49 for receipt of the word line selective signals 109, 110, 111 and 112 and also connected to the register 14 for receipt of the block selective signal 115 so that the word line driver 19 generates word line driving signals 125, 126, 127 and 128 in accordance with the word line selective signals 109, 110, 111 and 112 for selection of word lines of memory cells in a third memory cell array block 35. The third memory cell array block 35 has four memory cells 36, 37, 38 and 39, each of which is connected to bit lines. In the third memory cell array block 35, the memory cell 36 is connected to a word line W31 which is connected to the word line driver 19 so that the word line driving signal 125 is transmitted through the word line W31 to the memory cell 36. Namely, the word line driving signal 125 is a signal for selecting the word line W31 connected to the memory cell 36. In the third memory cell array block 35, the memory cell 37 is connected to a word line W32 which is connected to the word line driver 19 so that the word line driving signal 126 is transmitted through the word line W32 to the memory cell 37. Namely, the word line driving signal 126 is a signal for selecting the word line W32 connected to the memory cell 37. In the third memory cell array block 35, the memory cell 38 is connected to a word line W33 which is connected to the word line driver 19 so that the word line driving signal 127 is transmitted through the word line W33 to the memory cell 38. Namely, the word line driving signal 127 is a signal for selecting the word line W33 connected to the memory cell 38. In the third memory cell array block 35, the memory cell 39 is connected to a word line W34 which is connected to the word line driver 19 so that the word line driving signal 128 is transmitted through the word line W34 to the memory cell 39. Namely, the word line driving signal 128 is a signal for selecting the word line W34 connected to the memory cell 39. In the third memory cell array block 35, a pair of MOS field effect transistors 40 and 41 are provided which are respectively connected in series onto the bit lines. Gates of the paired MOS field effect transistors 40 and 41 are connected to each other for receipt of the common gate signal Yj.

A word line driver 20 is further provided, which is connected to the burst counter 49 for receipt of the word line selective signals 109, 110, 111 and 112 and also connected to the register 15 for receipt of the block selective signal 116 so that the word line driver 20 generates word line driving signals 129, 130, 131 and 132 in accordance with the word line selective signals 109, 110, 111 and 112 for selection of word lines of memory cells in a fourth memory cell array block 42. The fourth memory cell array block 42 has four memory cells 43, 44, 45 and 46, each of which is connected to bit lines. In the fourth memory cell array block 42, the memory cell 43 is connected to a word line W41 which is connected to the word line driver 20 so that the word line driving signal 129 is transmitted through the word line W41 to the memory cell 43. Namely, the word line driving signal 129 is a signal for selecting the word line W41 connected to the memory cell 43. In the fourth memory cell array block 42, the memory cell 44 is connected to a word line W42 which is connected to the word line driver 20 so that the word line driving signal 130 is transmitted through the word line W42 to the memory cell 44. Namely, the word line driving signal 130 is a signal for selecting the word line W42 connected to the memory cell 44. In the fourth memory cell array block 42, the memory cell 45 is connected to a word line W43 which is connected to the word line driver 20 so that the word line driving signal 131 is transmitted through the word line W43 to the memory cell 45. Namely, the word line driving signal 131 is a signal for selecting the word line W43 connected to the memory cell 45. In the fourth memory cell array block 42, the memory cell 46 is connected to a word line W44 which is connected to the word line driver 20 so that the word line driving signal 132 is transmitted through the word line W44 to the memory cell 46. Namely, the word line driving signal 132 is a signal for selecting the word line W44 connected to the memory cell 46. In the fourth memory cell array block 42, a pair of MOS field effect transistors 47 and 48 are provided which are respectively connected in series onto the bit lines. Gates of the paired MOS field effect transistors 47 and 48 are connected to each other for receipt of the common gate signal Yj As described above, the above memory device receives inputs of the clock signal 101, the burst mode control signal 102, the word line corresponding address signals 105 and 106 and the digit line corresponding address signals 107 and 108. The block selective signals 113, 114, 115 and 116 are supplied to the word line drivers 17, 18, 19 and 20 to select the word line drivers 17, 18, 19 and 20. The selected one of the word line drivers 17, 18, 19 and 20 generates the word line driving signals in accordance with the word line selective signals 109, 110, 111 and 112. The word line driving signals are transmitted on the word lines and supplied to the memory cells in the selected one of the memory cell array blocks 21, 28, 35 and 42. One of the memory cells in the selected one of the memory cell array blocks in accordance with the block selective signals is further selected in accordance with the word line driving signals supplied by the selected one of the word line drivers 17, 18, 19 and 20.

If, for example, the word line driver 17 is selected and the word line driving signal 117 is selected, then the memory cell 22 in the memory cell array block 21 is selected. The memory cell 22 is connected to the two bit lines which are connected via the MOS field effect transistors 26 and 27 acting as the digit line selective switches to the sense amplifier and the light amplifier. What one of the memory cells is selected by the word line driving signal means what said one of the memory cells is placed in read/write enable states.

Figures 2A, 2B, 2C:
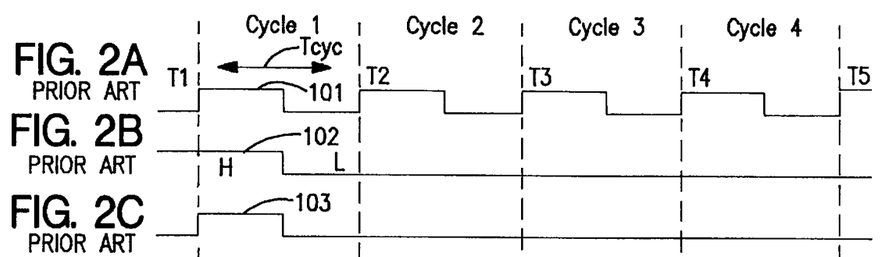
FIGS. 2A–2Q are timing charts illustrative of waveforms of individual signals transmitted through the conventional cache memory device operable in the burst mode.
Figure 2D:
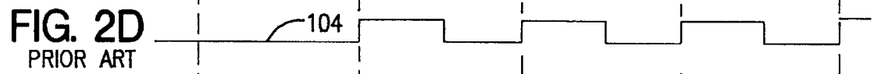
Figure 2E:
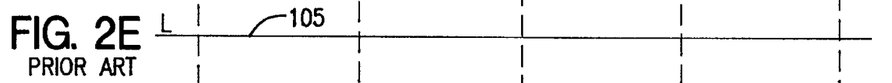
Figure 2F:
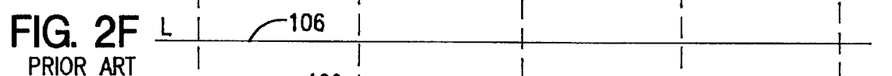
Figure 2G:
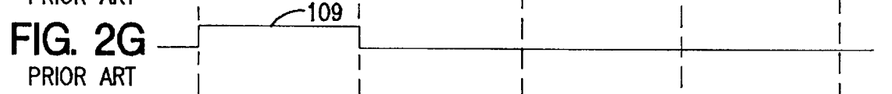
Figures 2H, 2I, 2J:
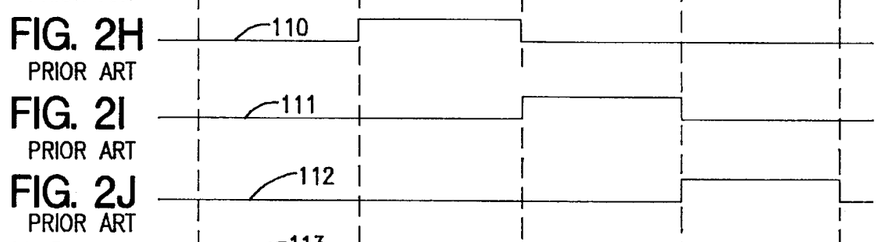
Figures 2K, 2L, 2M:
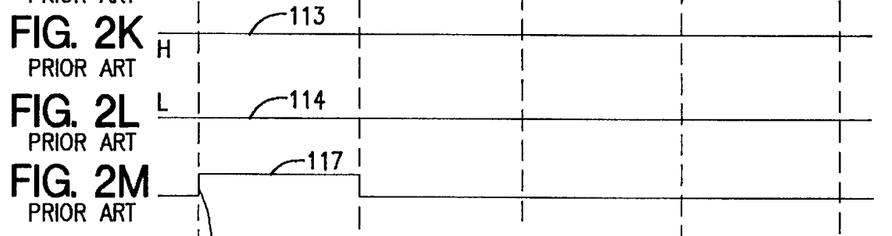
Figures 2N, 2O:
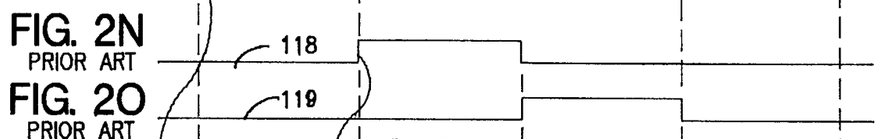
Figure 2P:
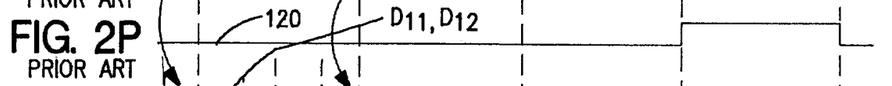
Figure 2Q:
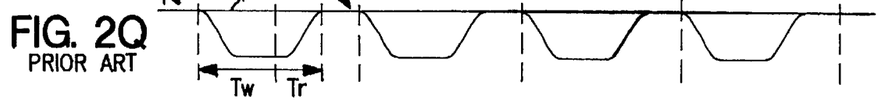

FIGS. 2A–2Q are timing charts illustrative of operational timing in the burst mode of the above conventional memory device illustrated in FIG. 1. The above conventional memory device is operated in four cycles, for example, "Cycle 1", "Cycle 2", "Cycle 3" and "Cycle 4". Each cycle comprises a constant time period "Tcyc". The four cycles "Cycle 1", "Cycle 2", "Cycle 3" and "Cycle 4" are bounded by times T1, T2, T3, T4 and T5. A waveform (a) represents a wave form of the clock signal 101 which is to be inputted into the burst operating control clock generator circuit 1. The clock signal 101 has a high level in a first half of each of the cycles "Cycle 1", "Cycle 2", "Cycle 3" and "Cycle 4" and has a low level in a subsequent second half thereof. A waveform (b) represents a wave form of the burst mode control signal 102 which is to be inputted into the burst operating control clock generator circuit 1. The burst mode control signal 102 has a high level in the first half term of the "Cycle 1" and then remains to have the low level in the second half of the "Cycle 1" and subsequent "Cycle 2", "Cycle 3" and "Cycle 4". A waveform (c) represents a wave form of the clock signal 103 generated by the burst operating control clock generator circuit 1. The clock signal 103 has a high level in the first half term of the "Cycle 1" and then remains to have the low level in the second half of the "Cycle 1" and subsequent "Cycle 2", "Cycle 3" and "Cycle 4". A waveform (d) represents a wave form of the clock signal 104 generated by the burst operating control clock generator circuit 1. The clock signal 104 has the low level in the "Cycle 1" and in the subsequent "Cycle 2", "Cycle 3" and "Cycle 4", the clock signal 104 has the high level in the first half term and has the low level in the second half term. A waveform (e) represents a waveform of the word line corresponding address signal 105 which is to be inputted into the address buffer 2. The word line corresponding address signal 105 remains low level through entire terms of "Cycle 1", "Cycle 2", "Cycle 3" and "Cycle 4". A waveform (f) represents a waveform of the word line corresponding address signal 106 which is to be inputted into the address buffer 3. The word line corresponding address signal 106 also remains low level through entire terms of "Cycle 1", "Cycle 2", "Cycle 3" and "Cycle 4". A waveform (g) represents a waveform of the word line selective signal 109 generated by the burst counter 49 and then inputted into the word line driver 17. The word line selective signal 109 has the high level in the "Cycle 1" and then remains to have the low level through the "Cycle 2", "Cycle 3" and "Cycle 4". A waveform (h) represents a waveform of the word line selective signal 110 generated by the burst counter 49 and then inputted into the word line driver 18. The word line selective signal 110 has the low level in the "Cycle 1" and then has the high level in the "Cycle 2". In both the "Cycle 3" and "Cycle 4", the word line selective signal 110 remains to have the low level. A waveform (i) represents a waveform of the word line selective signal 111 generated by the burst counter 49 and then inputted into the word line driver 19. The word line selective signal 111 has the low level in the "Cycle 1" and "Cycle 2" and then has the high level in the "Cycle 3". In the subsequent "Cycle 4", the word line selective signal 111 has the low level. A waveform (j) represents a waveform of the word line selective signal 112 generated by the burst counter 49 and then inputted into the word line driver 20. The word line selective signal 112 remains to have the low level through the "Cycle 1", "Cycle 2" and "Cycle 3". A waveform (k) represents a waveform of the block selective signal 113 generated by the resister 12 and then inputted into the word line driver 17. The block selective signal 113 remains to have the high level through the entire terms "Cycle 1", "Cycle 2", "Cycle 3" and "Cycle 4". A waveform (l) represents a waveform of the block selective signal 114 generated by the resister 13 and then inputted into the word line driver 18. The block selective signal 114 remains to have the low level through the entire terms "Cycle 1", "Cycle 2", "Cycle 3" and "Cycle 4". A waveform (m) represents a waveform of the word line driving signal 117 generated by the word line driver 17 and supplied via the word line W11 to the memory cell 22. The word line driving signal 117 has the high level in the "Cycle 1" and remains to have the low level in the subsequent "Cycle 2", "Cycle 3" and "Cycle 4". A waveform (n) represents a waveform of the word line driving signal 118 generated by the word line driver 17 and supplied via the word line W12 to the memory cell 23. The word line driving signal 118 has the low level in the "Cycle 1" and has the high level in the "Cycle 2". In the subsequent "Cycle 3" and "Cycle 4", the word line driving signal 118 has the low level. A waveform (o) represents a waveform of the word line driving signal 119 generated by the word line driver 17 and supplied via the word line W13 to the memory cell 24. The word line driving signal 119 has the low level in the "Cycle 1" and "Cycle 2" and then has the high level in the "Cycle 3". In the subsequent "Cycle 4", the word line driving signal 119 has the low level. A waveform (p) represents a waveform of the word line driving signal 120 generated by the word line driver 17 and supplied via the word line W14 to the memory cell 25. The word line driving signal 120 remains to have the low level in the "Cycle 1", "Cycle 2" and "Cycle 3". In the subsequent "Cycle 4", the word line driving signal 120 has the high level. A waveform (q) represents a waveform of the digit signals D11, D12 which are transmitted on the digit lines.

The burst mode control signal 102 has the high level in the first half term of the "Cycle 1" but has the low level in the second half term of the "Cycle 1" and subsequent "Cycle 2", "Cycle 3" and "Cycle 4". In the "Cycle 1", the cache memory device is placed in the normal operational state, for which reason the address signal 101 is received by the cache memory device. In the subsequent "Cycle 2", "Cycle 3" and "Cycle 4", the cache memory device enters into the burst mode. Through the "Cycle 1", "Cycle 2", "Cycle 3" and "Cycle 4", if the address signals 105 and 106, and the address signals 107 and 108 enter into the low level, then the block selective signal 113 enters into the high level whilst the block selective signal 114 enters into the low level. Since in the "Cycle 1" the cache memory device is placed in the normal operational state, in accordance with the clock signal 103 generated by the burst operating control lock generator circuit 1, the external address signal 105 of the low level and the external address signal 106 of the low level are received by the cache memory device. The word line selective signal 109 is selected via the decoder 4, and the register 5 and burst counter 49 and then transmitted to the word line driver 17. For selection of the block, the address signals 107 and 108 corresponding to the external digit lines D11 and D12 are received via the address buffers 9 and 10 by the decoder 11, wherein the address signals 107 and 108 are in the low level. Through the decoder 11 and the register 12, the block selective signal 113 is selected and then transmitted into the word line driver 17. The word line driver 17 generates the word line driving signal 117 in accordance with the word line selective signal 113 wherein the word line driving signal 117 corresponds to the memory cell array 21 included in the first block. The word line driving signal 117 is transmitted on the word line W11 which is connected to the memory cell 22 wherein the digit signals which waveforms are illustrated in FIG. 2Q are transmitted on the digit lines D11 and D12.

As described above, in the "Cycle 2", the operations of the cache memory device has entered into the burst mode, for which reason the burst operating control clock generator circuit 1 does not generate the clock signal 103. No address signal is received. The burst operating control clock generator circuit 1 does, however, generate the clock signal 104 to be inputted to the burst counter 49. The burst counter 49 generates the word line selective signals 110, 111 and 112 sequentially and transmits them to the word driver 18. The word line driver 17 generates the word line driving signals 118, 119 and 120 sequentially which are then transmitted on the word lines W12, W13 and W14 respectively whereby continuous address data are written into the memory cells 23, 24 and 25 which are connected to the word lines W12, W13 and W14.

In response to the high frequency performance of the central processing unit (CPU), the cycle time is required to be shortened. As illustrated in FIG. 2Q, data are written into the memory cell until a time duration Tw which correspond to the first half term of the "Cycle 1". After the data were written into the memory cells, the digit lines are equalized and precharged within a write recovery time Tr. In the above prior art, the data are written onto the same digit lines in the burst mode, for which reason within the one cycle time, not only the writing of the data into the memory but also the recovery of the digit lines are required to be carried out. This requires the following equation to be satisfied.

$$Tcyc \geq Tw + Tr \tag{1}$$

In typical one of the actual products of the memory device, Tw=5.6 nsec. and Tr=5.85 nsec. Then, the following equation is given.

$$Tcyc \geq 5.6 \text{ nsec.} + 5.85 \text{ nsec.} \tag{2}$$
$$= 11.5 \text{ nsec.}$$

If the above equation is expressed in the frequency, then the following equation is given.

$$f \leq 1/Tcyc = 86 \text{ MHz} \tag{3}$$

The above equation (3) shows that the frequency f of the operation in the burst mode is limited within 86 MHz which is defined by Tw and Tr.

As described above, the maximum frequency of the operation in the burst mode is limited by the time Tw necessary for data writing operation and the time Tr necessary for digit recovery.

In the above circumstances, it had been required to develop a novel semiconductor memory device operable in burst mode at a much higher frequency than the above conventional one.

SUMMARY OF THE INVENTION

Accordingly, it is an object of the present invention to provide a novel semiconductor memory device operable in the burst mode but free from the problems described above.

It is a further object of the present invention to provide a novel semiconductor memory device operable in the burst mode at a high frequency.

It is a still further object of the present invention to provide a circuitry provided in a semiconductor memory device operable in the burst mode and suitable for allowing an improvement in high frequency performance of the memory device.

It is yet a further object of the present invention to provide a novel method of controlling operations in burst mode of a semiconductor memory device free from the problems described above.

It is a furthermore object of the present invention to provide a novel method of controlling operations in burst mode of a semiconductor memory device for allowing an improvement in high frequency performance of the memory device.

The above and other objects, features and advantages of the present invention will be apparent from the following descriptions.

The present invention provides a semiconductor memory device operable in burst mode and having a predetermined block number of memory cell array blocks, in each of which a predetermined cell number of memory cells are aligned. The semiconductor memory device comprising: a burst mode control signal generation circuit for generating a burst mode control signal according to which the semiconductor memory device is operated in burst mode; a word line selective signal generation circuit for generating word line selective signals according to which any one of word lines connected to memory cells aligned in each of the memory cell array blocks is selected; a memory cell array block selective signal generation circuit being connected to the first means for receipt of the burst mode control signal from the first means, wherein the memory cell array block selective signal generation circuit generates memory cell array block selective signals sequentially and one by one through different and successive time cycles so that, according to the memory cell array block selective signals sequentially generated, the memory cell array blocks are also sequentially selected one by one through the different and successive time cycles; and a word line driver circuit being connected to the word line selective signal generation circuit for receipt of the word line selective signals and also connected to the memory cell array block selective signal generation circuit for sequentially receipt of the memory cell array block selective signals one by one through the different and successive time cycles to thereby generate word line driving signals which are transmitted on word lines connected to the memory cells aligned in the memory cell array blocks so that memory cells included in different memory cell array blocks are sequentially selected one by one through the different and successive time cycles.

It is preferable that data reading out/writing up operations are carried out in one cycle and subsequently digit line recovery operation is carried out to the digit line in the subsequent cycle different from the one cycle.

It is also preferable that the memory cell array block selective signal generation circuit has an output stage on which a burst counter is provided, which is connected to the burst mode control signal generation circuit for receipt of the burst mode control signal and also connected to the word line driver circuit for supplying the memory cell array block selective signals to the word line driver circuit.

The present invention also provides circuitry for generating memory cell array block selective signals which select memory cell array blocks included in a semiconductor memory device operable in burst mode, wherein the circuitry is operated under the control of a burst mode control signal to generate memory cell array block selective signals sequentially and one by one through different and successive time cycles so that, according to the memory cell array block selective signals sequentially generated, the memory cell array blocks are also sequentially selected one by one through the different and successive time cycles for sequentially supplying a word line driver circuit with the memory cell array block selective signals one by one through the different and successive time cycles whereby memory cells included in different memory cell array blocks are sequentially selected one by one through the different and successive time cycles.

It is preferable that data reading out/writing up operations are carried out in one cycle and subsequently digit line recovery operation is carried out to the digit line in the subsequent cycle different from the one cycle.

It is also preferable that the circuitry has an output stage on which a burst counter is provided.

The present invention also provides a method of controlling reading out/writing up operations of continuous address data in burst mode to memory cells aligned in memory cell array blocks, wherein under the control of a burst mode control signal, memory cell array block selective signals are sequentially generated one by one through different and successive time cycles so that, according to the memory cell array block selective signals sequentially generated, the memory cell array blocks are also sequentially selected one by one through the different and successive time cycles for sequentially supplying a word line driver circuit with the memory cell array block selective signals one by one through the different and successive time cycles whereby memory cells included in different memory cell array bloc are sequentially selected one by one through the different and successive time cycles.

BRIEF DESCRIPTIONS OF THE DRAWINGS

A preferred embodiment of the present invention will be described in detail with reference to the accompanying drawings.

PREFERRED EMBODIMENT

Figure 3A:
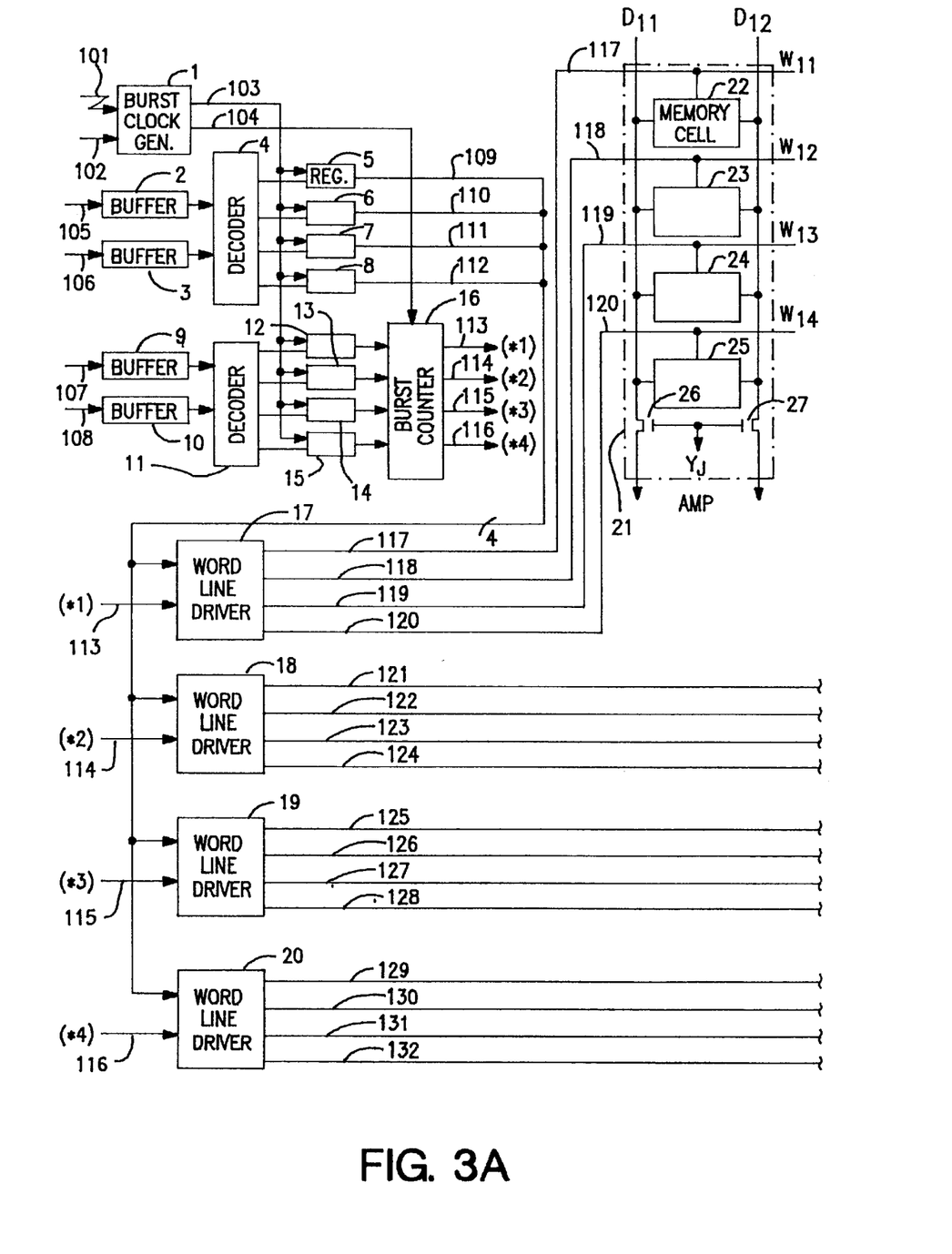
FIGS. 3A and 3B are a circuit diagram illustrative of a novel semiconductor memory device operable in the burst mode at a higher frequency in a preferred embodiment according to the present invention.
Figure 3B:
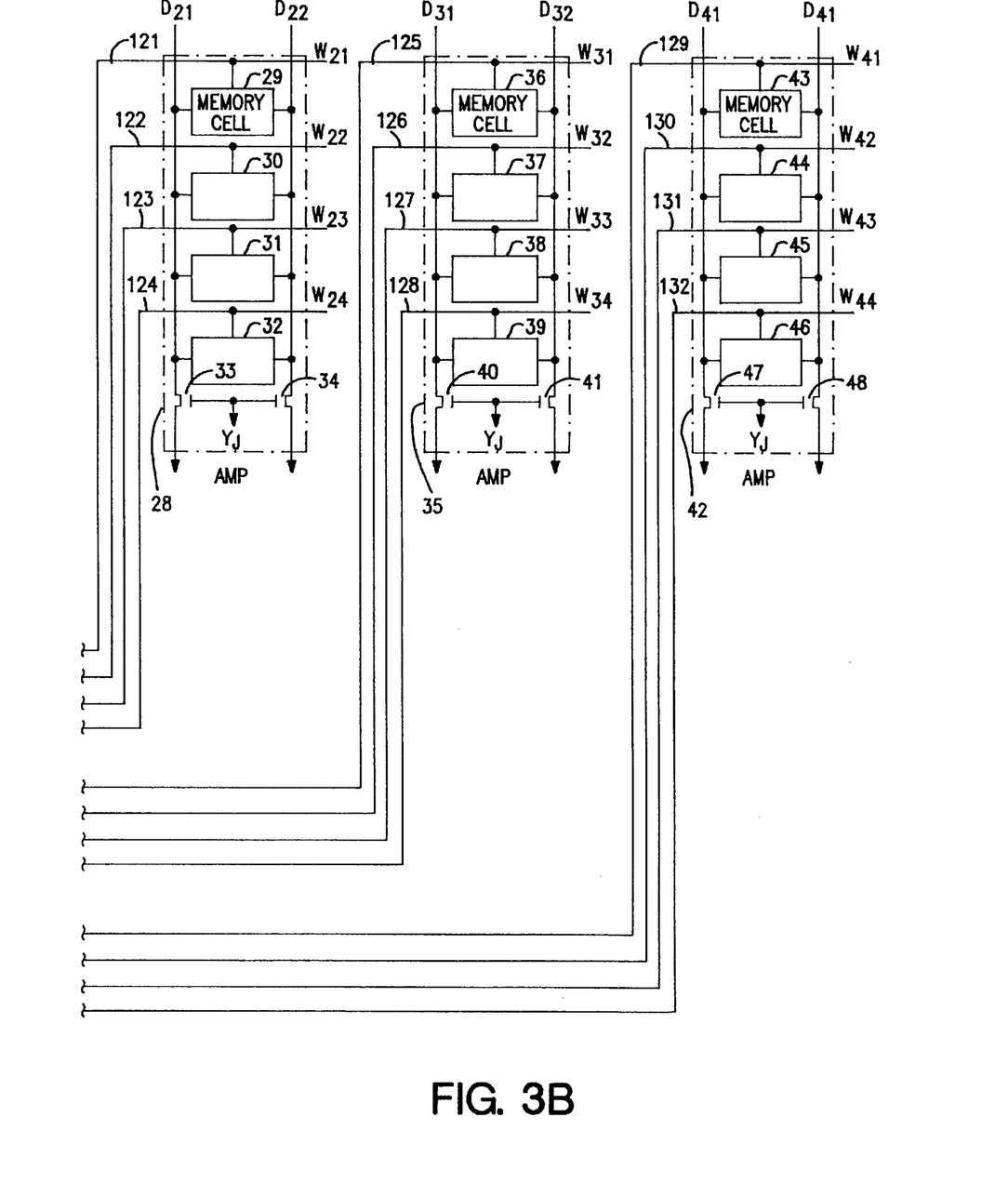
Figure 4A:
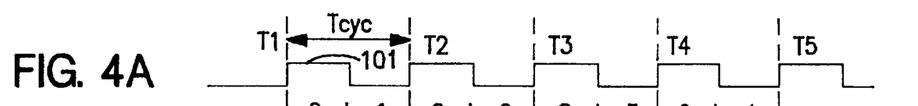
FIGS. 4A–4R are timing charts illustrative of waveforms of individual signals transmitted through a novel semiconductor memory device operable in the burst mode at a higher frequency in a preferred embodiment according to the present invention.
Figure 4B:
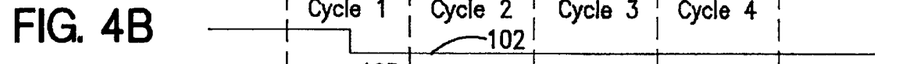
Figure 4C:
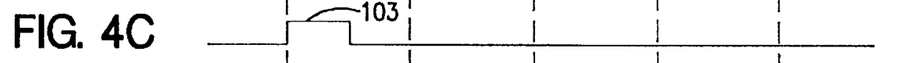
Figures 4D, 4E, 4F, 4G:
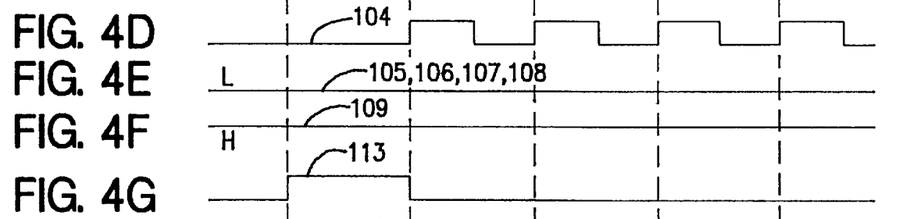
Figure 4H:
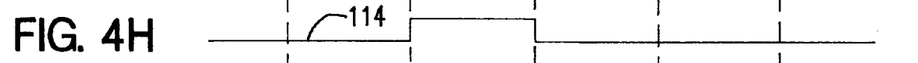
Figures 4I, 4J, 4K, 4L:
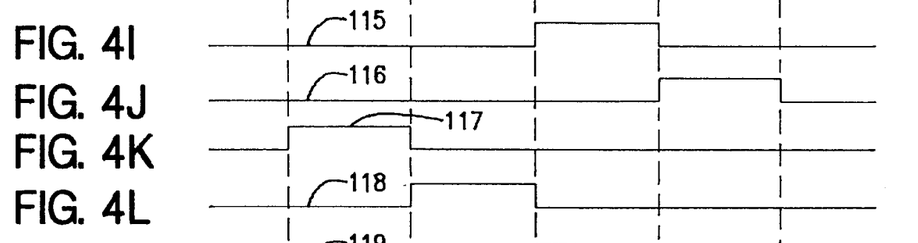
Figure 4M:
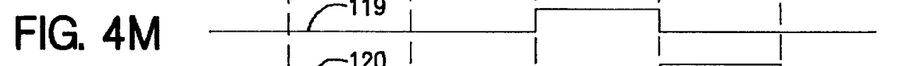
Figures 4N, 4O:
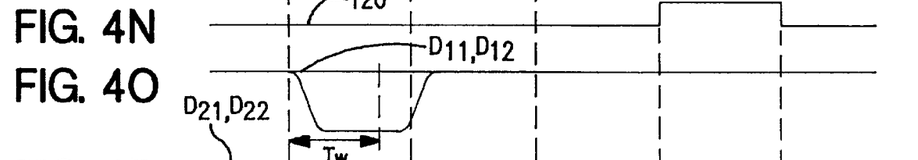
Figure 4P:
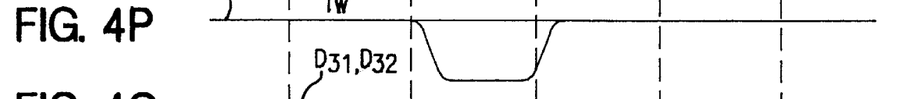
Figure 4Q:
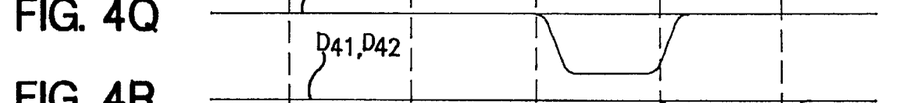
Figure 4R:
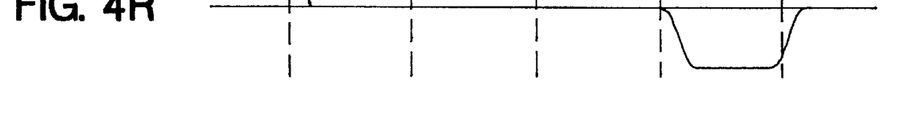

A preferred embodiment according to the present invention will be described with reference to FIGS. 3A and 3B, and FIGS. 4A–4R. FIGS. 3A and 3B are a circuit diagram illustrative of a novel semiconductor memory device operable in the burst mode at a higher frequency and FIGS. 4A–4R are timing charts illustrative of waveforms of individual signals transmitted through a novel semiconductor memory device operable in the burst mode at a higher frequency.

The novel semiconductor memory device is designed to improve the high frequency performance thereof. In the light of the circuit configuration, the novel semiconductor memory device illustrated in FIGS. 3A and 3B differ from the conventional one illustrated in FIGS. 1A and 1B. A difference in the circuit configuration of the novel semiconductor memory device from the conventional one is in a connection of a burst counter. This difference in the circuit configuration results from the requirement for avoiding data which are written into the same digit line continuously. In the conventional memory device, data are written into the same digit line continuously over at least two successive cycles. In FIGS. 2A–2Q data are written into the same digit line continuously over four successive cycles. By contrast, in accordance with the present invention, a burst counter is provided on an output stage of a block selective signal generator so that, in the burst mode, data read/write operations of reading out or writing up continuous address data are carried out by selecting different word lines one by one or separately in each block. Namely, continuous address data are not written into the same digit line continuously but are written in different digit lines for every cycle as illustrated in FIGS. 4A–4R, for which reason it is unnecessary to carry out, in the same cycle or the single cycle, both a writing operation of writing data into the memory cell and a recovery operation of the digit line. Namely, it is possible to carry out the data writing operation in one cycle and carry out the recovery operation to the digit line in the subsequent or next cycle from the above one cycle. It is, therefore, required to satisfy the following equation.

$$Tcyc \geq Tw \qquad (5)$$

where Tcyc is the time duration of each cycle and Tw is the time necessary for writing data into the memory cell. Similarly to the prior art described above, when Tw=5.6 nsec. Then, the following equation is given.

$$T_{cyc} \geq 5.6 \text{ nsec.} \qquad (6)$$

If the above equation is expressed in the frequency, then the following equation is given.

$$f \leq 1/T_{cyc} = 178 \text{ MHz} \qquad (7)$$

The above equation (7) shows that the frequency "f" of the operation in the burst mode is limited within 178 MHz which is defined by Tw only. The maximum frequency of the operation in the burst mode is limited by the time Tw necessary for data writing operation. This maximum frequency of operation in the burst mode of the novel memory device is about two times of that of the conventional memory device described above. Accordingly, when the burst counter is provided on the output stage of the block selective signal generator results a remarkable improvement in the high frequency performance of the memory device is achieved. The improvement in the high frequency performance of the memory device provides an improvement in high speed performance of the reading out and writing up operations of data into the memory cells of the memory device in the burst mode.

With reference to FIGS. 3A and 3B, the circuit configuration of the novel memory device will be described in detail. A burst operating control clock generator circuit 1 is provided, which is deigned to receive a clock signal 101 and a burst mode control signal 102 and generate clock signals 103 and 104. An address buffer 2 is provided, which is designed to receive a word line corresponding address signal 105 which corresponds to the word line and generate the said word line corresponding address signal 105. An address buffer 3 is also provided, which is designed to receive a word line corresponding address signal 106 which corresponds to the word line and generate the said word line corresponding address signal 106. A decoder 4 is provided which is connected to the address buffers 2 and 3 for receipt of the word line corresponding address signals 105 and 106 and generating the decoded signals. Four registers 5, 6, 7, and 8 are provided which are connected to the decoder 4 for receipt of the decoded address signals and also connected to the burst operating control signal generator circuit 1 for receipt of the clock signal 103 so that the registers 5, 6, 7, and 8 are operated to temporarily store the decoded address signals under the control of the clock signal 103 from the burst operating control signal generator circuit 1 and to generate word line selective signals 109, 110, 111 and 112. An address buffer 9 is provided which is designed to receive a digit line corresponding address signal 107 corresponding to the digit line and generate that address signal 107. An address buffer 10 is also provided which is designed to receive a digit line corresponding address signal 108 corresponding to the digit line and generate that address signal 108. A decoder 11 is provided which is connected to the address buffers 9 and 10 for receipt of the digit line corresponding address signals 107 and 108 to generate decoded address signals. Four registers 12, 13, 14 and 15 are provided which are connected to the decoder 11 for receipt of the decoded address signals and also connected to the burst operating control signal generator circuit 1 for receipt of the clock signal 103 so that the registers 12, 13, 14 and 15 are operated to temporary store the decoded address signals under the control of the clock signal 103 from the burst operating control signal generator circuit 1. A burst counter 16 is provided, which is connected to the registers 12, 13, 14, and 15 for receipt of the decoded address signals and also connected to the burst operating control signal generator circuit 1 for receipt of the clock signal 104 so that the burst counter 16 performs a counting operation on the basis of the clock signal 104 and to generate block selective signals 113, 114, 115 and 116 sequentially.

A word line driver 17 is further provided, which is connected to the registers 5, 6, 7 and 8 for receipt of the word line selective signals 109, 110, 111 and 112 and also connected to the burst counter 16 for receipt of the block selective signal 113 so that the word line driver 17 generates word line driving signals 117, 118, 119 and 120 in accordance with the word line selective signals 109, 110, 111 and 112 for selection of word lines of memory cells in a first memory cell array block 21. The first memory cell array block 21 has four memory cells 22, 23, 24 and 25, each of which is connected to bit lines. In the first memory cell array block 21, the memory cell 22 is connected to a word line W11 which is connected to the word line driver 17 so that the word line driving signal 117 is transmitted through the word line W11 to the memory cell 22. Namely, the word line driving signal 117 is a signal for selecting the word line W11 connected to the memory cell 22. In the first memory cell array block 21, the memory cell 23 is connected to a word line W12 which is connected to the word line driver 17 so that the word line driving signal 118 is transmitted through the word line W12 to the memory cell 23. Namely, the word line driving signal 118 is a signal for selecting the word line W12 connected to the memory cell 23. In the first memory cell array block 21, the memory cell 24 is connected to a word line W13 which is connected to the word line driver 17 so that the word line driving signal 119 is transmitted through the word line W13 to the memory cell 24. Namely, the word line driving signal 119 is a signal for selecting the word line W13 connected to the memory cell 24. In the first memory cell array block 21, the memory cell 25 is connected to a word line W14 which is connected to the word line driver 17 so that the word line driving signal 120 is transmitted through the word line W14 to the memory cell 25. Namely, the word line driving signal 120 is a signal for selecting the word line W14 connected to the memory cell 25. In the first memory cell array block 21, a pair of MOS field effect transistors 26 and 27 are provided which are respectively connected in series onto bit lines or digit lines D11 and D12. Gates of the paired MOS field effect transistors 26 and 27 are connected to each other for receipt of the common gate signal Yj.

A word line driver 18 is further provided, which is connected to the registers 5, 6, 7 and 8 for receipt of the word line selective siglnals 109, 110 111, 112 and also connected to the burst counter 16 for receipt of the block selective signal 114 so that the word line driver 18 generates word line driving signals 121, 122, 123 and 124 in accordance with the word line selective signals 109, 110 111, 112 for selection of word lines of memory cells in a second memory cell array block 28. The second memory cell array block 23 has four memory cells 29, 30, 31 and 32, each of which is connected to bit lines. In the second memory cell array block 28, the memory cell 29 is connected to a word line W21 which is connected to the word line driver 18 so that the word line driving signal 121 is transmitted through the word line W21 to the memory cell 29. Namely, the word line driving signal 121 is a signal for selecting the word line W21 connected to the memory cell 29. In the second memory cell array block 28, the memory cell 30 is connected to a word line W22 which is connected to the word line driver 18 so that the word line driving signal 122 is transmitted through the word line W22 to the memory cell 30. Namely, the word line driving signal 122 is a signal for selecting the word line W22 connected to the memory cell 30. In the second memory cell array block 28, the memory cell 31 is connected to a word line W23 which is connected to the word line driver 18 so that the word line driving signal 123 is transmitted through the word line W23 to the memory cell 31. Namely, the word line driving signal 123 is a signal for selecting the word line W23 connected to the memory cell 31. In the second memory cell array block 28, the memory cell 32 is connected to a word line W24 which is connected to the word line driver 18 so that the word line driving signal 124 is transmitted through the word line W24 to the memory cell 32. Namely, the word line driving signal 124 is a signal for selecting the word line W24 connected to the memory cell 32. In the second memory cell array block 28, a pair of MOS field effect transistors 33 and 34 are provided which are respectively connected in series onto bit lines or digit lines D21 and D22. Gates of the paired MOS field effect transistors 33 and 34 are connected to each other for receipt of the common gate signal Yj.

A word line driver 19 is further provided, which is connected to the registers 5, 6, 7 and 8 for receipt of the word line selective signals 109, 110, 111 and 112 and also connected to the burst counter 16 for receipt of the block selective signal 115 so that the word line driver 19 generates word line driving signals 125, 126, 127 and 128 in accordance with the word line selective signals 109, 110, 111 and 112 for selection of word lines of memory cells in a third memory cell array block 35. The third memory cell array block 35 has four memory cells 36, 37, 38 and 39, each of which is connected to bit lines. In the third memory cell array block 35, the memory cell 36 is connected to a word line W31 which is connected to the word line driver 19 so that the word line driving signal 125 is transmitted through the word line W31 to the memory cell 36. Namely, the word line driving signal 125 is a signal for selecting the word line W31 connected to the memory cell 36. In the third memory cell array block 35, the memory cell 37 is connected to a word line W32 which is connected to the word line driver 19 so that the word line driving signal 126 is transmitted through the word line W32 to the memory cell 37. Namely, the word line driving signal 126 is a signal for selecting the word line W32 connected to the memory cell 37. In the third memory cell array block 35, the memory cell 38 is connected to a word line W33 which is connected to the word line driver 19 so that the word line driving signal 127 is transmitted through the word line W33 to the memory cell 38. Namely, the word line driving signal 127 is a signal for selecting the word line W33 connected to the memory cell 38. In the third memory cell array block 35, the memory cell 39 is connected to a word line W34 which is connected to the word line driver 19 so that the word line driving signal 128 is transmitted through the word line W34 to the memory cell 39. Namely, the word line driving signal 128 is a signal for selecting the word line W34 connected to the memory cell 39. In the third memory cell array block 35, a pair of MOS field effect transistors 40 and 41 are provided which are respectively connected in series onto bit lines or digit lines D31 and D32. Gates of the paired MOS field effect transistors 40 and 41 are connected to each other for receipt of the common gate signal Yj.

A word line driver 20 is further provided, which is connected to the registers 5, 6, 7, and 8 for receipt of the word line selective signals 109, 110, 111 and 112 and also connected to the burst counter 16 for receipt of the block selective signal 116 so that the word line driver 20 generates word line driving signals 129, 130, 131 and 132 in accordance with the word line selective signals 109, 110, 111 and 112 for selection of word lines of memory cells in a fourth memory cell array block 42. The fourth memory cell array block 42 has four memory cells 43, 44, 45 and 46, each of which is connected to bit lines. In the fourth memory cell array block 42, the memory cell 43 is connected to a word line W41 which is connected to the word line driver 20 so that the word line driving signal 129 is transmitted through the word line W41 to the memory cell 43. Namely, the word line driving signal 129 is a signal for selecting the word line W41 connected to the memory cell 43. In the fourth memory cell array block 42, the memory cell 44 is connected to a word line W42 which is connected to the word line driver 20 so that the word line driving signal 130 is transmitted through the word line W42 to the memory cell 44. Namely, the word line driving signal 130 is a signal for selecting the word line W42 connected to the memory cell 44. In the fourth memory cell array block 42, the memory cell 45 is connected to a word line W43 which is connected to the word line driver 20 so that the word line driving signal 131 is transmitted through the word line W43 to the memory cell 45. Namely, the word line driving signal 131 is a signal for selecting the word line W43 connected to the memory cell 45. In the fourth memory cell array block 42, the memory cell 46 is connected to a word line W44 which is connected to the word line driver 20 so that the word line driving signal 132 is transmitted through the word line W44 to the memory cell 46. Namely, the word line driving signal 132 is a signal for selecting the word line W44 connected to the memory cell 46. In the fourth memory cell array block 42, a pair of MOS field effect transistors 47 and 48 are provided which are respectively connected in series onto bit lines or digit lines D41 and D42. Gates of the paired MOS field effect transistors 47 and 48 are connected to each other for receipt of the common gate signal Yj.

As described above, in accordance with the present invention, the burst counter 16 is provided through which block selective signals 113, 114, 115 and 116 are generated so that in the burst mode the block selective signals 113, 114, 115 and 116 are sequentially selected one by one through different and successive four cycles, whereby word line drivers 17, 18, 19 and 20 are sequentially selected one by one through the different four cycles to sequentially select different four memory cell array blocks 21, 28, 35 and 42 through the different and successive four cycles. For selecting the word lines, if the word line selection signal 109 is selected, then the word lines W11, W21, W31 and W41 in the different four memory cell array blocks 21, 28, 35 and 42 are, therefore, sequentially selected one by one through the different and successive four cycles. If, however, the word line selection signal 110 is selected, then the word lines W12, W22, W32 and W42 in the different four memory cell array blocks 21, 28, 35 and 42 are, therefore, sequentially selected one by one through the different and successive four cycles.

FIG. 4A–4R are timing charts illustrative of operational timing in the burst mode of the above conventional memory device illustrated in FIGS. 3A and 3B. The above memory device is operated in four cycles, for example, "Cycle 1", "Cycle 2", "Cycle 3" and "Cycle 4". Each cycle comprises a constant time period "Tcyc". The four cycles "Cycle 1", "Cycle 2", "Cycle 3" and "Cycle 4" are bounded by times T1, T2, T3, T4 and T5. A waveform (a) represents a wave form of the clock signal 101 which is to be inputted into the burst operating control clock generator circuit 1. The clock signal 101 has a high level in a first half of each of the cycles "Cycle 1", "Cycle 2", "Cycle 3" and "Cycle 4" and has a low level in a subsequent second half thereof. A waveform (b) represents a wave form of the burst mode control signal 102 which is to be inputted into the burst operating control clock generator circuit 1. The burst mode control signal 102 has a high level in the first half term of the "Cycle 1" and then remains to have the low level in the second half of the "Cycle 1" and subsequent "Cycle 2", "Cycle 3" and "Cycle 4". A waveform (c) represents a wave form of the clock signal 103 generated by the burst operating control clock generator circuit 1. The clock signal 103 has a high level in the first half term of the "Cycle 1" and then remains to have the low level in the second half of the "Cycle 1" and subsequent "Cycle 2", "Cycle 3" and "Cycle 4". A waveform (d) represents a wave form of the clock signal 104 generated by the burst operating control clock generator circuit 1. The clock signal 104 has the low level in the "Cycle 1" and in the subsequent "Cycle 2", "Cycle 3" and "Cycle 4", the clock signal 104 has the high level in the first half term and has the low level in the second half term. A waveform (e) represents a waveform of each of the word line corresponding address signals 105, 106, 107 and 108 which are to be inputted into the address buffers 2, 3, 9 and 10. The word line corresponding address signals 105, 106, 107 and 108 remain low level through entire terms of "Cycle 1", "Cycle 2", "Cycle 3" and "Cycle 4". A waveform (f) represents a waveform of the word line selective signal 109 generated by the resister 5 and then inputted into the word line drivers 17, 18, 19 and 20. The word line selective signal 109 remain high level through entire terms of "Cycle 1", "Cycle 2", "Cycle 3" and "Cycle 4". A waveform (g) represents a waveform of the block selective signal 113 generated by the burst counter 16 and then inputted into the word line driver 17. The block selective signal 113 has the high level in the "Cycle 1" and then remains to have the low level through the "Cycle 2", "Cycle 3" and "Cycle 4". A waveform (h) represents a waveform of the block selective signal 114 generated by the burst counter 16 and then inputted into the word line driver 18. The block selective signal 114 has the low level in the "Cycle 1" and then has the high level in the "Cycle 2". In the subsequent "Cycle 3" and "Cycle 4", the block selective signal 114 remains to have the low level. A waveform (i) represents a waveform of the block selective signal 115 generated by the burst counter 16 and then inputted into the word line driver 19. The block selective signal 115 remains to have the low level in the "Cycle 1" and "Cycle 2" and then has the high level in the "Cycle 3". In the subsequent "Cycle 4", the block selective signal 115 has the low level. A waveform (j) represents a waveform of the block selective signal 116 generated by the burst counter 16 and then inputted into the word line driver 20. The block selective signal 116 remains to have the low level in the "Cycle 1", "Cycle 2" and "Cycle 3". In the subsequent "Cycle 4", the block selective signal 115 has the high level. A waveform (k) represents a waveform of the word line driving signal 117 generated by the word line driver 17 and supplied via the word line W11 to the memory cell 22. The word line driving signal 117 has the high level in the "Cycle 1" and remains to have the low level in the subsequent "Cycle 2", "Cycle 3" and "Cycle 4". A waveform (l) represents a waveform of the word line driving signal 118 generated by the word line driver 17 and supplied via the word line W12 to the memory cell 23. The word line driving signal 118 has the low level in the "Cycle 1" and has the high level in the "Cycle 2". In the subsequent "Cycle 3" and "Cycle 4", the word line driving signal 118 has the low level. A waveform (m) represents a waveform of the word line driving signal 119 generated by the word line driver 17 and supplied via the word line W13 to the memory cell 24. The word line driving signal 119 has the low level in the "Cycle 1" and "Cycle 2" and then has the high level in the "Cycle 3". In the subsequent "Cycle 4", the word line driving signal 119 has the low level. A waveform (n) represents a waveform of the word line driving signal 120 generated by the word line driver 17 and supplied via the word line W14 to the memory cell 25. The word line driving signal 120 remains to have the low level in the "Cycle 1", "Cycle 2" and "Cycle 3". In the subsequent "Cycle 4", the word line driving signal 120 has the high level. A waveform (o) represents a waveform of the digit signals which are transmitted on the digit lines D11, D12 in the memory cell array block 21. The digit signals appear only in the "Cycle 1". A waveform (p) represents a waveform of the digit signals which are transmitted on the digit lines D21, D22 in the memory cell array block 28. The digit signals appear only in the "Cycle 2". A waveform (q) represents a waveform of the digit signals which are transmitted on the digit lines D31, D32 in the memory cell array block 35. The digit signals appear only in the "Cycle 3". A waveform (r) represents a waveform of the digit signals which are transmitted on the digit lines D41, D42 in the memory cell array block 42. The digit signals appear only in the "Cycle 4".

The burst mode control signal 102 has the high level in the first half term of the "Cycle 1" but has the low level in the second half term of the "Cycle 1" and subsequent "Cycle 2", "Cycle 3" and "Cycle 4". In the "Cycle 1", the cache memory device is placed in the normal operational state, for which reason the address signal 101 is received by the cache memory device. In the subsequent "Cycle 2", "Cycle 3" and "Cycle 4", the cache memory device enters into the burst mode. Through the "Cycle 1", "Cycle 2", "Cycle 3" and "Cycle 4", if the address signals 105 and 106, and the address signals 107 and 108 remain in the low level, then in the "Cycle 1", the block selective signal 113 enters into the high level whilst the block selective signals 114, 115 and 116 enter into the low level. Since in the "Cycle 1" the cache memory device is placed in the normal operational state, in accordance with the clock signal 103 generated by the burst operating control lock generator circuit 1, the external address signal 105 of the low level and the external address signal 106 of the low level are received by the cache memory device. The word line selective signal 109 is selected and supplied to the word line driver 17. The address signals 107 and 108 of the low level are received. The burst counter 16 generates the block selective signal 113 which is then supplied to the word line driver 17. As a result, the memory cell array block 21 is selected. The word line driver 17 generates the word line driving signal 117 of the high level which is then transmitted on the word line W11 to the memory cell 21 in the memory cell array block 21. As a result, the digit signals which waveforms are illustrated in FIG. 4(o) are transmitted on the digit lines D11 and D12 and written into the memory cell 22.

As described above, in the subsequent "Cycle 2", "Cycle 2" and the "Cycle 4" operations of the cache memory device has entered into the burst mode, for which reason the burst operating control clock generator circuit 1 does not generate the clock signal 103. No external address signal is received. The burst operating control clock generator circuit 1 does, however, generate the clock signal 104 to be inputted to the burst counter 16. The burst counter 16 generates the block selective signals 114, 115 and 116 sequentially and transmitted to the word drivers 18, 19 and 20 respectively. The word line drivers 18, 19 and 20 generate the word line driving signals 121, 125 and 129 sequentially which are then transmitted on the word lines W21, W31 and W41 respectively, whereby continuous address data are written into the memory cell 29 in the memory cell array block 28, the memory cell 36 in the memory cell array block 35, and the memory cell 43 in the memory cell array block 42 respectively.

In response to the high frequency performance of the central processing unit (CPU), the cycle time is required to be shortened. As illustrated in FIGS. 4A–4R data are written into the memory cell until a time duration Tw which correspond to the major term of the "Cycle 1". After the data were written into the memory cells, the digit lines are equalized and precharged within a write recovery time Tr. In the above prior art, the data are written onto the same digit lines in the burst mode, for which reason within the one cycle time, not only the writing of the data into the memory but also the recovery of the digit lines are required to be carried out. By contrast, in accordance with the present invention, a burst counter is provided on an output stage of a block selective signal generator so that, in the burst mode, data read/write operations of reading out or writing up continuous address data are carried out by selecting different word lines one by one or separately in each block. Namely, continuous address data are not written into the same digit line continuously but are written in different digit lines for every cycles as illustrated in FIGS. 4A–4R, for which reason it is unnecessary to carry out, in the same cycle or the single cycle, both a writing operation of writing data into the memory cell and a recovery operation of the digit line. Namely, it is possible to carry out the data writing operation in one cycle and carry out the recovery operation to the digit line in the subsequent or next cycle from the above one cycle. It is, therefore, required to satisfy the following equation.

$$Tcyc \geq Tw \qquad (5)$$

where Tcyc is the time duration of each cycle and Tw is the time necessary for writing data into the memory cell. Similarly to the prior art described above, when Tw=5.6 nsec. Then, the following equation is given.

$$Tcyc \geq 5.6 \text{ nsec.} \qquad (6)$$

If the above equation is expressed in the frequency, then the following equation is given.

$$f \leq 1/Tcyc = 178 \text{ MHz} \qquad (7)$$

The above equation (7) shows that the frequency "f" of the operation in the burst mode is limited within 178 MHz which is defined by Tw only. The maximum frequency of the operation in the burst mode is limited by the time Tw necessary for data writing operation. This maximum frequency of operation in the burst mode of the novel memory device is about two times of that of the conventional memory device described above. Accordingly, what the burst counter be provided on the output stage of the block selective signal generator results in a remarkable improvement in the high frequency performance of the memory device. The improvement in the high frequency performance of the memory device means to provide an improvement in high speed performance of the reading out and writing up operations of data into the memory cells of the memory device in the burst mode.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. A semiconductor memory device operable in burst mode and having a predetermined block number of memory cell array blocks, in each of which a predetermined cell number of memory cells are aligned, said semiconductor memory device comprising:

a first means for generating a burst mode control signal according to which said semiconductor memory device is operated in burst mode;

a second means for generating word line selective signals according to which any one of word lines connected to memory cells aligned in each of said memory cell array blocks is selected;

a third means being connected to said first means for receipt of said burst mode control signal from said first means, said third means generating memory cell array block selective signals sequentially and one by one through different and successive time cycles so that, according to said memory cell array block selective signals sequentially generated, said memory cell array blocks are also sequentially selected one by one through said different and successive time cycles; and a fourth means being connected to said second means for receipt of said word line selective signals and also connected to said third means for sequential receipt of said memory cell array block selective signals one by one through said different and successive time cycles to thereby generate word line driving signals which are transmitted on word lines connected to said memory cells aligned in said memory cell array blocks so that memory cells included in different memory cell array blocks are sequentially selected one by one through said different and successive time cycles.

2. The semiconductor memory device as claimed in claim 1, wherein data reading out/writing up operations are carried out in one cycle and subsequently digit line recovery operation is carried out to the digit line in the subsequent cycle different from said one cycle.

3. The semiconductor memory device as claimed in claim 1, wherein said third means comprises a circuit having an output stage on which a burst counter is provided, which is connected to said first means for receipt of said burst mode control signal and also connected to said fourth means for supplying said memory cell array block selective signals to said fourth means.

4. A semiconductor memory device operable in burst mode and having a predetermined block number of memory cell array blocks, in each of which a predetermined cell number of memory cells are aligned, said semiconductor memory device comprising:

a burst mode control signal generation circuit for generating a burst mode control signal according to which said semiconductor memory device is operated in burst mode;

a word line selective signal generation circuit for generating word line selective signals according to which any one of word lines connected to memory cells aligned in each of said memory cell array blocks is selected;

a memory cell array block selective signal generation circuit being connected to said burst mode control signal generation circuit for receipt of said burst mode control signal from said burst mode control signal generation circuit, said memory cell array block selective signal generation circuit generating memory cell array block selective signals sequentially and one by one through different and successive time cycles so that, according to said memory cell array block selective signals sequentially generated, said memory cell array blocks are also sequentially selected one by one through said different and successive time cycles; and a word line driver circuit being connected to said word line selective signal generation circuit for receipt of said word line selective signals and also connected to said memory cell array block selective signal generation circuit for sequentially receipt of said memory cell array block selective signals one by one through said different and successive time cycles to thereby generate word line driving signals which are transmitted on word lines connected to said memory cells aligned in said memory cell array blocks so that memory cells included in different memory cell array blocks are sequentially selected one by one through said different and successive time cycles.

5. The semiconductor memory device as claimed in claim 4, wherein data reading out/writing up operations are carried out in one cycle and subsequently digit line recovery operation is carried out to the digit line in the subsequent cycle different from said one cycle.

6. The semiconductor memory device as claimed in claim 4, wherein said memory cell array block selective signal generation circuit has an output stage on which a burst counter is provided, which is connected to said burst mode control signal generation circuit for receipt of said burst mode control signal and also connected to said word line driver circuit for supplying said memory cell array block selective signals to said word line driver circuit.

7. A circuitry for generating memory cell array block selective signals which select memory cell array blocks included in a semiconductor memory device operable in burst mode, said circuitry being operated under the control of a burst mode control signal to generate memory cell array block selective signals sequentially and one by one through different and successive time cycles so that, according to said memory cell array block selective signals sequentially generated, said memory cell array blocks are also sequentially selected one by one through said different and successive time cycles for sequentially supplying a word line driver circuit with said memory cell array block selective signals one by one through said different and successive time cycles whereby memory cells included in different memory cell array blocks are sequentially selected one by one through said different and successive time cycles.

8. The circuitry as claimed in claim 7, wherein data reading out/writing up operations are carried out in one cycle and subsequently digit line recovery operation is carried out to the digit line in the subsequent cycle different from said one cycle.

9. The circuitry as claimed in claim 7, wherein said circuitry has an output stage on which a burst counter is provided.

10. A method of controlling reading out/writing up operations of continuous address data in burst mode to memory cells aligned in memory cell array blocks, wherein under the control of a burst mode control signal, memory cell array block selective signals are sequentially generated one by one through different and successive time cycles so that, according to said memory cell array block selective signals sequentially generated, said memory cell array blocks are also sequentially selected one by one through said different and successive time cycles for sequentially supplying a word line driver circuit with said memory cell array block selective signals one by one through said different and successive time cycles whereby memory cells included in different memory cell array blocks are sequentially selected one by one through said different and successive time cycles.

11. The method as claimed in claim 10, wherein data reading out/writing up operations are carried out in one cycle and subsequently digit line recovery operation is carried out to the digit line in the subsequent cycle different from said one cycle.

* * * * *